(12) United States Patent
Meszlenyi

(10) Patent No.: US 7,173,829 B2
(45) Date of Patent: Feb. 6, 2007

(54) PULSE TRANSITION TIME MODULATION POWER CONVERTER

(76) Inventor: Ivan Meszlenyi, Apt8-105 TwentyFifth St, Toronto, Ontario (CA) M8V 3P9

(*) Notice: Subject to any disclaimer, the term of this patent is extended or adjusted under 35 U.S.C. 154(b) by 0 days.

(21) Appl. No.: 11/252,420

(22) Filed: Oct. 19, 2005

(65) Prior Publication Data

US 2006/0077694 A1  Apr. 13, 2006

(30) Foreign Application Priority Data

Oct. 7, 2004  (CA) ..................................... 2481277

(51) Int. Cl.
*H02M 3/335* (2006.01)
(52) U.S. Cl. ......................................... 363/16; 363/41
(58) Field of Classification Search .................. 363/15, 363/16, 40, 41, 95, 131
See application file for complete search history.

(56) References Cited

U.S. PATENT DOCUMENTS

| 4,382,275 | A | * | 5/1983 | Glennon ...................... 363/41 |
| 5,539,630 | A | * | 7/1996 | Pietkiewicz et al. .......... 363/17 |
| 5,625,542 | A | * | 4/1997 | Stemmler et al. ............. 363/41 |

* cited by examiner

*Primary Examiner*—Adolf Berhane

(57) ABSTRACT

A PTTM (Pulse Transition Time Modulation) power converter includes an input terminal supplied by a PWM (Pulse Width Modulated) signal, a PWM to PTTM converter, a controlled capacitance proportional to the pulse transition time, a pulse amplifier driving a power transformer, a gate drive transformer, and synchronous rectification means. The output voltage can be kept constant by varying the pulse transition time to cancel the effect of fluctuation of the operating voltage or variation of the load.

14 Claims, 4 Drawing Sheets

PULSE TRANSITION TIME MODULATION POWER CONVERTER

BACKGROUND OF THE INVENTION

1. Field of the Invention

The present invention relates generally to PWM power converters, those having high efficiency in spite of the high operating frequency. More specifically, the present invention relates to high frequency PWM power converters having ultra-low voltage output.

2. Description of the Prior Art

Achieving fast response time and small size by increasing the frequency of operation generally leads to increased switching losses and lower efficiency. Prior art does not provide a satisfactory PWM converter of fixed frequency operation, above 1 MHz, and exhibits poor efficiency under high line light load conditions.

OBJECTS AND SUMMARY OF THE INVENTION

Accordingly, the object of the invention is to provide a PWM converter that is free from the defects encountered in the prior art PWM power converters. Another object of the invention is to provide regulation by the PWM signal in response to fluctuation of operating voltage and variation of load conditions. A further object of the invention is to provide a fixed frequency power converter operating above 1 MHz with substantially reduced switching losses. Other objects, features and advantages will be apparent from the following description taken in conjunction with the accompanying drawings in which like references designate the same elements.

DETAILED DESCRIPTION OF THE PREFERRED EMBODIMENT

In accordance with the present invention a PTTM power converter is provided which includes a signal input circuit for supplying a pulse width modulated signal, a controlled capacitance proportional to the pulse width of said PWM signal, a PWM to PTTM (Pulse Transition Time Modulation) converting logic, a pulse amplifier connected to the primary of a power transformer having a predetermined leakage and magnetizing inductance, and a first resonant capacitor connected in series with the primary of said power transformer. Synchronous rectification is provided by a pair of transistors driven by a gate drive transformer having a predetermined leakage and magnetizing inductance wherein said magnetizing inductance forms a parallel resonant tank with the gate to source capacitance of said synchronous rectifiers. A second resonant capacitor is connected in series with the primary winding of the gate drive transformer to form a series resonant tank with the leakage inductance of said gate drive transformer.

Figure 1:
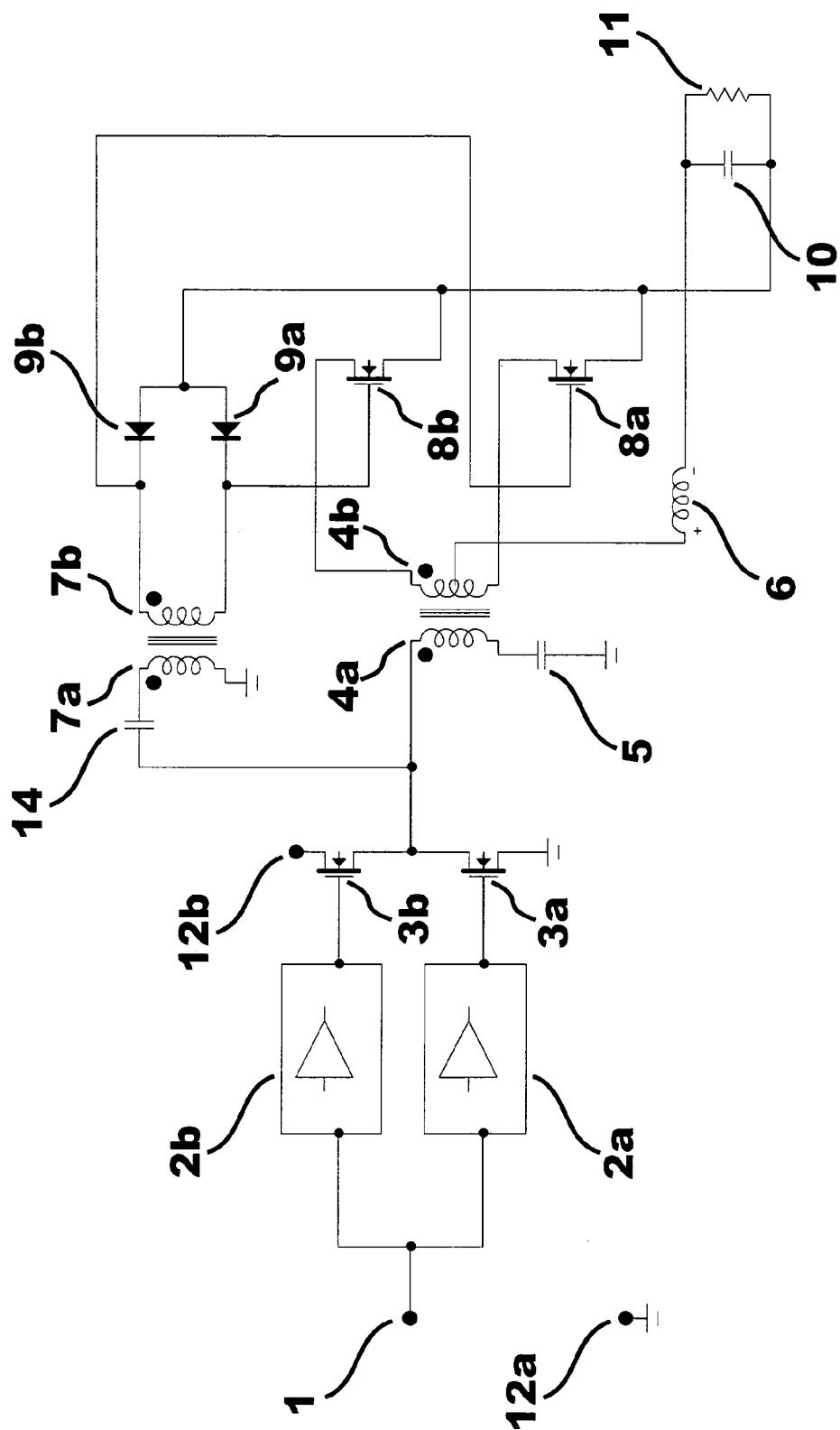
FIG. 1 is a schematic diagram showing a prior art PWM power converter.

In order to better understand the present invention a prior art ultra low voltage isolated PWM power converter will be described with reference to FIG. 1. PWM signal 1 is connected to first and second transistor drivers 2b and 2a, the output signals of said drivers are connected to the gate terminals first and second transistors 3b and 3a, said transistors are additionally provided with two output terminals. Two of said output terminals are joined and the remaining two output terminals are connected across first DC supply terminal 12b and second DC supply terminal 12a. The junction of the output terminals of transistors 3b and 3a are connected to the dotted end of primary winding 4a of the power transformer which is in series with resonant capacitor 5 the other side of which is connected to the second DC supply terminal 12a. Synchronous rectifiers 8a and 8b are both provided with a gate and two output terminals. The dotted end and the undotted end of secondary winding 4b of the power transformer are connected to the output terminals of first and second synchronous rectifier transistors 8b and 8a respectively. The gate terminals of transistors 8a and 8b are connected to the dotted and undotted ends of the secondary winding 7b of the gate drive transformer respectively. The dotted end of the primary winding 7a of the gate drive transformer is connected to the junction of the output terminals of transistors 3a and 3b via coupling capacitor 13 and the undotted end of primary winding 7a of said transformer is connected to the second DC supply terminal 12a. The center tap of secondary winding 4b of the power transformer is connected to output inductor 6 which is in turn connected to an output capacitor 10 and a load 11. The other side of output capacitor 10 and load 11 are joined and connected to the joined output terminals of transistors 8a and 8b. The cathodes of rectifiers 9a and 9b are connected to the two ends of the secondary winding 7b of the gate drive transformer and the anodes of said rectifiers 9a and 9b are connected to the joined output terminals of synchronous rectifier transistors 8a and 8b.

Figure 3A:
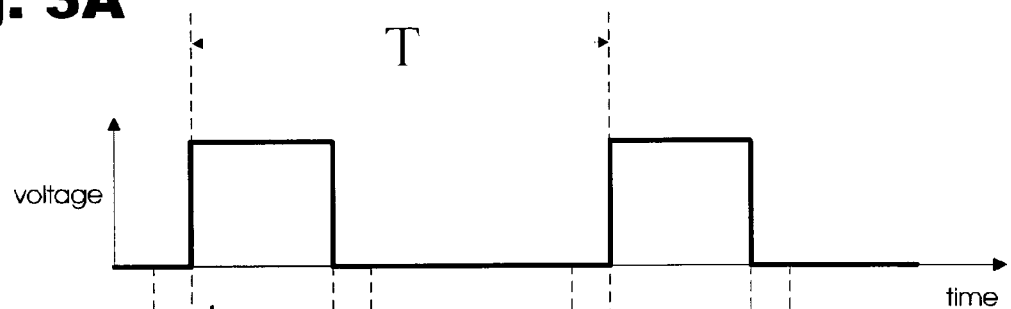
FIGS. 3A to 3D are the waveforms associated with the prior art power converter.
Figure 3B:
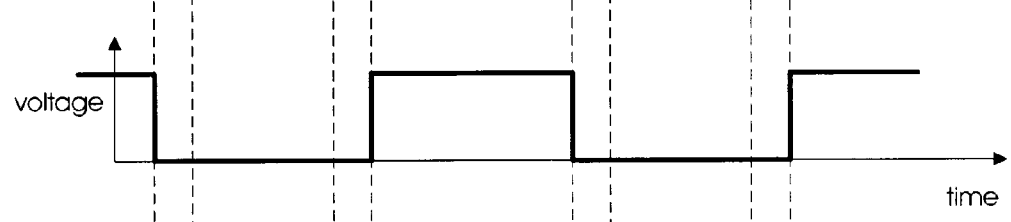
Figure 3C:
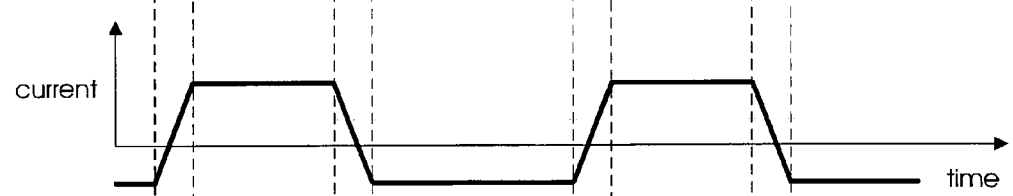
Figure 3D:

FIGS. 3A and 3B show a drive signal at the gate terminals of transistors 3b and 3a respectively. The time interval T is the duration for which transistors 3a and 3b are in the off state. The current in the primary winding 4a of the power transformer as shown in FIG. 3C, must have an average of 0 due to capacitive coupling which means that the time integral of the positive portion of the current is the same as the negative portion and since the positive portion is smaller in duration its amplitude is proportionally higher. This difference in current results in a difference in reactive energy available prior to transitions which will destroy the quality of the waveform present at 50% duty cycle and will introduce switching losses which will limit the frequency of operation below the 1 MHz level if high efficiency is to be achieved.

The losses associated with driving the high capacitance of the synchronous rectifiers are also significant in limiting the frequency of operation. It can be shown that a capacitance driven by a reactive energy exchange means will dissipate power on its equivalent series resistance that is directly proportional to the slope of the driving waveform such as is the case with synchronous MOSFET rectifiers that exhibit series equivalent parasitic resistances in the range of 0.5 to 2 ohm. Accordingly, $$P = \frac{2 * I^2 * R_g * t_0}{T}$$

where P is power dissipation, I is the current in the primary during transition, $R_g$ is the equivalent series gate resistance, $t_0$ is the transition time, and T is the period.

Even if the driving waveform is maintained at the ideal, trapezoidal, the losses associated with the gate capacitances become significant for any reasonable slope selected for a given design above 1 MHz. Slow rise and fall times would introduce yet another loss component associated with synchronous rectification, namely the intrinsic diode conduction.

Figure 2:
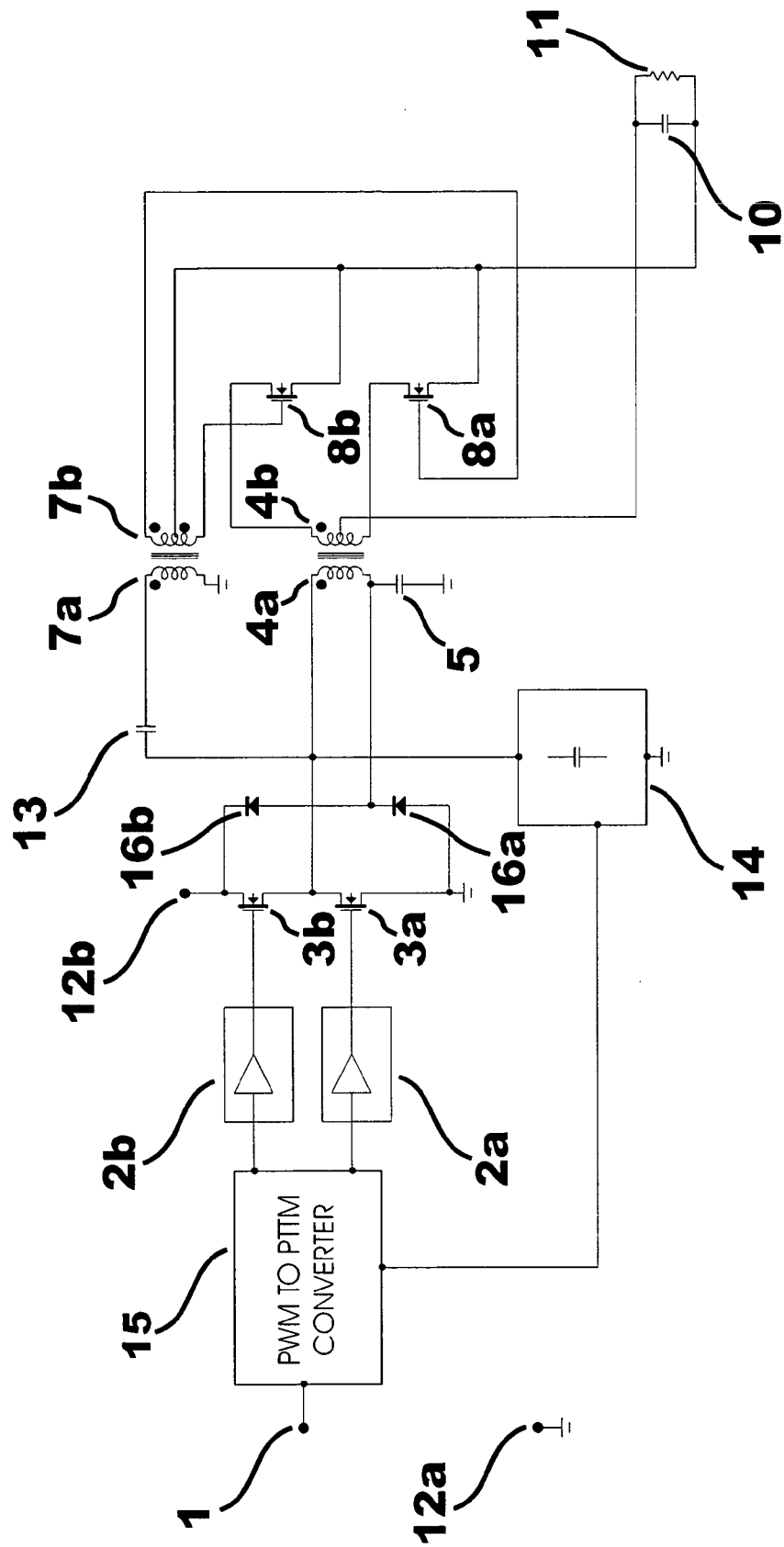
FIG. 2 is a schematic diagram showing an example of the PTTM power converter according to the present invention.

Next, an example of the PTTM power converter according to the present invention, which is free from the above defects, will be described with reference to FIG. 2 in which the references corresponding to those of FIG. 1 designate the same elements. PWM signal 1 is connected PWM to PTTM converter 15 having its drive outputs connected to first and second transistor drivers 2b and 2a, the output signals of said drivers are connected to the gate terminals first and second transistors 3b and 3a, said transistors are additionally provided with two output terminals. Two of said output terminals are joined and the remaining two output terminals are connected across first DC supply terminal 12b and second DC supply terminal 12a. The junction of the output terminals of transistors 3b and 3a are connected to the dotted end of primary winding 4a of the power transformer which is in series with first resonant capacitor 5 the other side of which is connected to the second DC supply terminal 12a. Synchronous rectifiers 8a and 8b are both provided with a gate and two output terminals. The dotted end and the undotted end of secondary winding 4b of the power transformer are connected to the output terminals of first and second synchronous rectifier transistors 8b and 8a respectively. The gate terminals of transistors 8a and 8b are connected to the dotted and undotted ends of the secondary winding 7b of the gate drive transformer respectively. The dotted end of the primary winding 7a of the gate drive transformer is connected to the junction 11 of the output terminals of transistors 3a and 3b via second resonant capacitor 13 and the undotted end of primary winding 7a of said transformer is connected to the second DC supply terminal 12a. The center tap of secondary winding 4b of the power transformer is connected to an output capacitor 10 and a load 11. The other side of output capacitor 10 and load 11 are joined and connected to the joined output terminals of transistors 8a and 8b and the center tap of secondary winding 7b of the gate drive transformer. The cathode of rectifier 16b is connected to the first DC supply rail 12b and the anode of rectifier 16a is connected to the second DC supply rail 12a. The anode of rectifier 16b and the cathode of rectifier 16a are joined and connected to the junction of first resonant capacitor 5 and primary winding 4a of the power transformer. Controlled capacitance 14 is connected between the junction of transistors 3a and 3b and the second DC supply rail 12a and is being fed by the control signal generated by the PWM to PTTM converter 15.

Figure 4A:
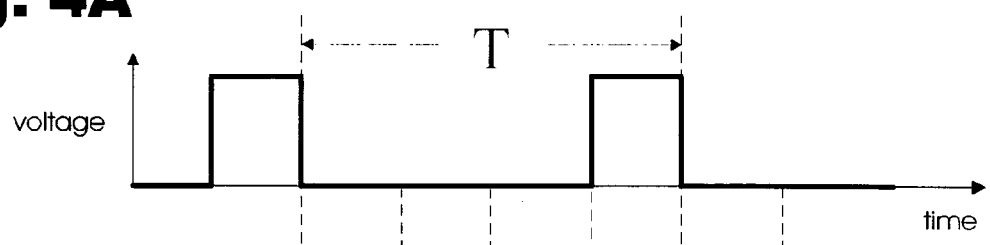
FIGS. 4A to 4E are the waveforms illustrating the operation of the power converter according to the present invention.
Figure 4B:
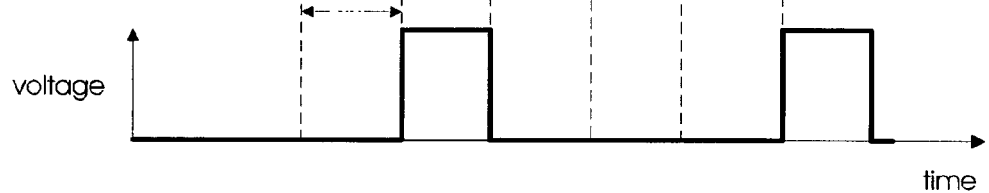

The operation of the PTTM converter is best explained with reference to the waveforms shown in FIGS. 4A through 4E. The Pulse Width Modulated signal will be converted to Pulse Transition Time Modulation signals as shown in FIGS. 4A and 4B. The pulse transition time, which is the duration for which both transistors 3a and 3b are in the off state, is represented by $\tau$ and the period is represented by T.

The transition at the junction of transistors 3a and 3b is purely reactive meaning that the energy available from the magnetizing and leakage inductances of the power transformer is charging controlled capacitance 14 to the DC supply rail. The value of controlled capacitance 14 is proportional to the off time or pulse transition time $\tau$. The corresponding voltage waveform is shown in FIG. 4D.

Figure 4C:
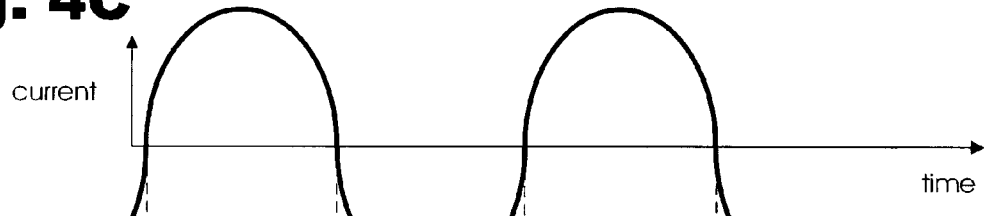
Figure 4D:
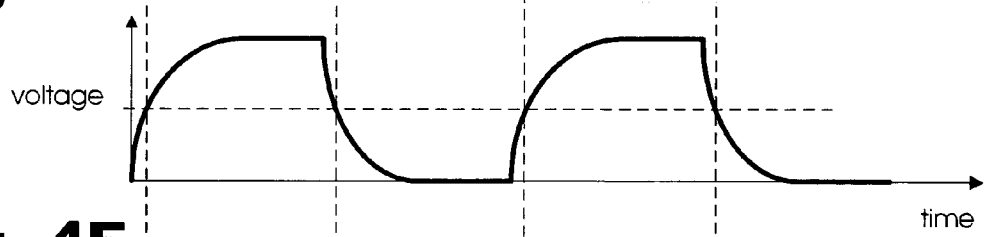
Figure 4E:
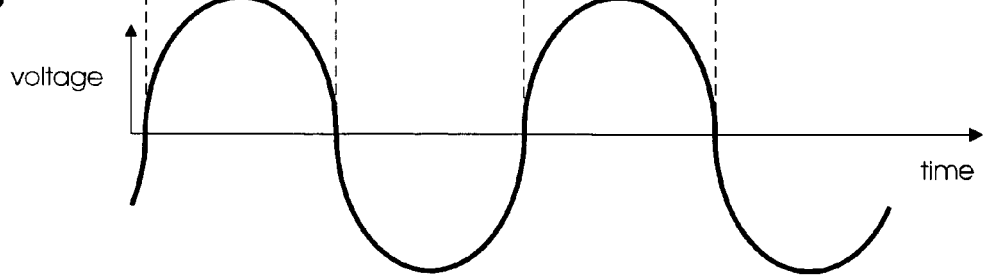

The leakage inductance of the power transformer forms a resonant tank with first resonant capacitor 5 which results in a sinusoidal current in the primary winding 4a of the power transformer as shown in FIG. 4C and this will ensure zero voltage and nearly zero current switching for transistors 3a and 3b. The magnetizing inductance of the gate drive transformer in conjunction with the gate to source capacitance of synchronous rectifiers 8a and 8b will form a parallel resonant tank that is tuned to the drive frequency F where F=1/T. The voltage across the gate and source terminal of 8a is shown in FIG. 4E.

Second resonant capacitor 13 is selected to form a series resonant tank with the leakage inductance of the gate drive transformer. The gate drive voltage amplitude is set up by the equilibrium of the energy delivered in each cycle via the series resonant tank and energy used up by the intrinsic gate resistances of synchronous rectifiers 8a and 8b. Since the current flowing through the synchronous rectifiers 8a and 8b is sinusoidal and in phase with the gate drive signal therefore it is sufficient to turn on the synchronous rectifiers 8a and 8b without loss of the effectiveness of said rectifiers. A suitable high value output capacitor 10 across the load 11 averages the current flowing in said load. The peak value of the fundamental component of a square wave under low line full load condition appearing across the junction of transistors 3a and 3b is $$V_{SUPPLY} * \left(\frac{4}{\pi}\right).$$

This waveform will become nearly sinusoidal at high line light load having a peak amplitude of $V_{SUPPLY}$. Therefore, the maximum theoretical ratio of the output voltages of the PTTM converter, from low line high load to high line light load, cannot exceed $$\frac{4}{\pi}.$$

Rectifiers 16a and 16b are used to limit the voltage across first resonant capacitor 5 so as to limit the maximum available current to load 11.

According to the present invention a power converter is presented that is operational above 1 MHz at high efficiency using synchronous rectification with substantial gate to source capacitance.

It will be apparent that many modifications and variation could be effected by one skilled in the art without departing from the spirit or scope of the novel concepts of the present invention, so that the spirit and scope of the invention should be determined by the appended claims only.

I claim as my invention:

1. A PTTM (Pulse Transition Time Modulation) power converter comprising:
   a. a signal input means for supplying a pulse width modulated signal to regulate the voltage across a load;
   b. a PWM to PTTM converter having an input, two drive output terminals, and a control output terminal, the input terminal is supplied with said pulse width modulated signal;
   c. first and second transistor drivers each having an input and an output, their inputs are connected to the drive outputs of said PWM to PTTM converter;
   d. a DC voltage source having first and second voltage rails;
   e. first and second switching transistors each having a control electrode and a pair of output electrodes wherein two of said output electrodes are joined to form an output and said control electrodes are connected to the outputs of said first and second transistor drivers;
   f. a power transformer having its primary connected to the joined output of first and second transistors;
   g. a first series resonant capacitor connected in series with the primary winding of said power transformer;
   h. first and second synchronous rectifier transistors each having a control and two output electrodes wherein one output electrode of the first synchronous rectifier transistor and one output electrode of the second synchronous rectifier transistor are joined to form a first output terminal;
   i. a second resonant capacitor connected to the output of said first and second switching transistors;
   j. a drive transformer having its primary connected in series with said second resonant capacitor;
   k. a controlled capacitance connected between the output of first and second transistors and second DC supply rail, said controlled capacitance having a control input connected to the control output of said PWM to PTTM converter;
   l. an output capacitor connected to the center tap of the secondary winding of the power transformer, to form a second output terminal, and to the first output terminal;
   m. a load connected across said first and second output terminals.

2. A PTTM power converter as in , wherein said PWM signal is converted to pulse transition time signals which are proportional to said PWM signal.

3. A PTTM power converter as in claims 1 or 2, wherein the output signals of said PTTM converter are fed to said fist and second transistor drivers.

4. A PTTM power converter as in claim 1, wherein two of the output electrodes of first and second switching transistors are joined to form an output.

5. A PTTM power converter as in claims 1 or 4, wherein the two remaining output electrodes of first and second switching transistors are connected to said first and second DC supply rail.

6. A PTTM power converter as in , wherein the primary winding of said power transformer is connected to said output of first and second switching transistors and has a center tapped secondary winding.

7. A PTTM power converter as in claims 1 or 6, wherein said power transformer has predetermined magnetizing and leakage inductances.

8. A PTTM power converter as in claim 1, wherein the leakage inductance of said power transformer forms a series resonant tank with said first resonant capacitor.

9. A PTTM power converter as in claim 1, wherein the energy released in the magnetizing and leakage inductances of said power transformer is equal to the energy stored in said controlled capacitance at the end of each transition under all line and load conditions.

10. A PTTM power converter as in claim 1, wherein the drive transformer has a primary winding connected to the output of said first and second transistors via said second resonant capacitor and has a centre tapped secondary winding.

11. A PTTM power converter as in claims 1 or 10, wherein said drive transformer has predetermined magnetizing and leakage inductances.

12. A PTTM power converter as in claim 1, wherein the leakage inductance of said drive transformer forms a series resonant tank with said second resonant capacitor.

13. A PTTM power converter as in claims 1 or 10, wherein the magnetizing inductance of said drive transformer forms a parallel resonant tank with the capacitance present between the control and output electrodes of said first and second synchronous rectifier transistors.

14. A PTTM power converter as in , wherein said controlled capacitance is proportional to said PWM input signal.

* * * * *